United States Patent

Miyashita et al.

[11] Patent Number: 5,604,060
[45] Date of Patent: Feb. 18, 1997

[54] HALFTONE PHASE SHIFT PHOTOMASK COMPRISING A SINGLE LAYER OF HALFTONE LIGHT BLOCKING AND PHASE SHIFTING

[75] Inventors: Hiroyuki Miyashita; Sachiko Ishikita; Koichi Mikami, all of Tokyo, Japan

[73] Assignee: Dai Nippon Printing Co., Ltd., Tokyo, Japan

[21] Appl. No.: 357,350

[22] Filed: Dec. 16, 1994

Related U.S. Application Data

[63] Continuation of Ser. No. 113,765, Aug. 31, 1993, abandoned.

[51] Int. Cl.$^6$ ............................................. G03F 9/00
[52] U.S. Cl. ........................... 430/5; 430/322; 430/324
[58] Field of Search .......................... 430/5, 322, 324

[56] References Cited

U.S. PATENT DOCUMENTS

| | | | |
|---|---|---|---|
| 5,286,581 | 2/1994 | Lee | 430/5 |
| 5,322,748 | 6/1994 | Watakabe et al. | 430/5 |
| 5,409,789 | 7/1993 | Ito | 430/5 |

FOREIGN PATENT DOCUMENTS 3-144453  6/1991  Japan .

OTHER PUBLICATIONS

Nakajima et al, ( "Attenuated Phase–Shifting Mask with a single–layer absorptive shifter of CrO, CrON, MoSi and MoSiON filter"; SPIE Meeting, Mar. 1994, paper No. 2197–10).

*Primary Examiner*—S. Rosasco
*Attorney, Agent, or Firm*—Sughrue, Mion, Zinn, Macpeak & Seas

[57] ABSTRACT

The invention provides a halftone phase shift photomask that is of much more simplified structure and so can be fabricated much more easily, which comprises a transparent substrate 10 and a single halftone light-blocking and phase shift layer 11 that is formed on the surface thereof according to a predetermined pattern and is made up of a material of homogeneous composition, characterized in that:

said single halftone light-blocking and phase shift layer has a film thickness d that is virtually equal to a value defined by $$d = \lambda / \{2(n-1)\}$$

where $\lambda$ is the wavelength at which the photomask is used, and n is the index of refraction of the single layer, or that is an odd-numbered multiple of said value, and has a transmittance lying substantially in the range of 5 to 30%. The layer 11 may be made up of any of $CrO_x$, $CrN_x$, $CrO_xN_y$ and $CrO_xN_yC_z$.

9 Claims, 4 Drawing Sheets

HALFTONE PHASE SHIFT PHOTOMASK COMPRISING A SINGLE LAYER OF HALFTONE LIGHT BLOCKING AND PHASE SHIFTING

This is a continuation of application Ser. No. 08/113,765 filed Aug. 31, 1993, abandoned.

BACKGROUND OF THE INVENTION

The present invention relates to a method for fabricating photomasks used for the production of high-density integrated circuits such as LSIs, VLSIs, etc., and more particularly to a method for fabricating a halftone phase shift photomask used for forming fine patterns with high accuracy.

Semiconductor integrated circuits such as ICs, LSIs and VLSIs are now fabricated by repeating the so-called lithography process wherein a resist is coated on the substrate to be processed, like a silicon wafer, and exposed to a desired pattern through a stepper, etc., followed by development, etching, doping, CVD, etc.

A photomask used for such a lithography process and called a reticle is now increasingly required to have much higher accuracy in association with the high performance and high integration of semiconductor integrated circuits. Referring to a typical LSI, i.e., a DRAM by way of example, a 5× reticle for a 1 megabit DRAM, i.e., a reticle of size five times as large as that of an exposure pattern should be very small in terms of dimensional variation; the accuracy demanded is as small as 0.15 μm even at the mean value ±3σ (σ is the standard deviation). Likewise, a dimensional accuracy of 0.1 to 0.15 μm is demanded for 5× reticles for 4 megabit DRAMs; and a dimensional accuracy of 0.05 to 0.1 μm for 5× reticles for 16 megabit DRAMs.

In addition, the line widths of device patterns formed with the use of these reticles are now becoming finer; for instance, they must be 1.2 μm for 1 megabit DRAMs, 0.8 μm for 4 megabit DRAMs, and 0.6 μm for 16 megabit DRAMs. To meet such demands, various photolithography technologies are now under investigation.

In the case of the next generation device patterns of the 64 megabit DRAM class for instance, however, the use of stepper photolithography technologies using conventional reticles will place some limit on resolving the resist patterns. To exceed this limit, a reticle known as a phase shift mask and designed on the basis of a new technological paradigm has been proposed in the art, as set forth in JP-A-58-173744, JP-B-62-59296, etc. Phase lithography making use of this phase shift reticle is a technology that enables the resolving power and contrast of a projected image to be increased by manipulation of the phase of light transmitting through the reticle.

A halftone phase shift photomask is now proposed as one of such phase shift masks. This halftone phase shift photomask will now be explained briefly with reference to FIGS. 3(a–d) and 4(a–d). FIG. 3(a–d) is a schematic of the principle of halftone phase shift lithography, and FIG. 4(a–d) is a schematic of a conventional process. FIGS. 3(a) and 4(a) are sectional views of the reticles used, FIGS. 3(b) and 4(b) represent the amplitude of light transmitting through the reticles, FIGS. 3(c) and 4(c) illustrate the amplitude of light on the wafers, and FIGS. 3(d) and 4(d) show the intensity of light on the wafers. Reference numeral 1 is a substrate, 2 a 100% light-blocking layer, 3 a halftone light-blocking film having a transmittance of 5 to 30%, 4 a phase shift layer, and 5 incident light. In the conventional arrangement, the substrate 1 made up of glass or other material is simply provided with the 100% light-blocking layer 2 for the purpose of defining a light transmitting portion according to a given pattern, as shown in FIG. 4(a). In the halftone phase shift lithographic arrangement, however, the halftone light-blocking film 3 is provided thereon with the phase shift layer 4 made up of a light-transmitting film for phase reversal (with a 180° phase difference), as shown in FIG. 3(a). In the conventional process, therefore, the amplitude of light on the reticle is in the same phase, as shown in FIG. 4(b), and so is the amplitude of light on the wafer, as shown in FIG. 4(c); the light intensity distribution on the wafer does not take the form corresponding to the mask pattern, and spreads outwardly from the portions under the opening in the mask, as can be seen from FIG. 4(d). In the case of halftone phase shift lithography, in contrast, the light passing through the halftone light-blocking film 3 and the phase shift layer 4 is in the opposite phase with respect to the light passing through the openings in the mask, as can be seen from FIG. 3(b), so that the intensity of light can be reduced to zero at the pattern boundary, thus making it possible to prevent the light intensity distribution from spreading outwardly, as can be seen from FIG. 4(d). Thus, halftone phase shift lithography makes it possible to resolve a pattern which, until now, cannot be resolved, resulting in an improvement in resolution.

Then, reference will be made to how to fabricate a typical halftone phase shift photomask so far brought forward in the art. FIG. 5 is a sectional schematic showing the photosteps of fabricating it, in which 19 stands for a substrate, 20 an electrically conductive layer, 21 a halftone light-blocking layer, 22 a phase shift layer, 23 a resist, 24 a resist pattern, 25 an etching gas, 26 a halftone light-blocking pattern, and 27 a phase shifter pattern.

First, a halftone phase shift photomask blank is prepared by a conventional procedure such as one shown in FIG. 5(a), followed by pattern defect inspection. Then, as shown in FIG. 5(b), the ionizing radiation resist 23 made up of, e.g., chloromethylated polystyrene is uniformly coated on the blank by spin coating or other known techniques, followed by drying-by-heating. This drying-by-heating treatment may usually be done at 80° to 150° C. for 20 to 60 minutes, although varying depending on the type of resist used. Then, a predetermined pattern is written on the resist layer 23 by means of ionizing radiation in conventional manners with an exposure system such as an electron beam lithography system, developed with a developer composed mainly of an organic solvent such as ethyl cellosolve or ester, and rinsed with alcohol to form such a resist pattern as shown in FIG. 5(c).

If needed, heat and descumming treatments are subsequently conducted for removal of undesired matters such as resist scum and whisker which remain on the edge portions of the resist pattern 24. Following this, as shown in FIG. 5(d), the portions of the phase shift layer 22 and the halftone light-blocking layer 21 under the openings in the resist pattern 24 are continuously dry etched, while the conditions for the etching gas plasma 25 are varied, thereby forming the halftone light-blocking pattern 26 and phase shifter pattern 27. As will be obvious to those skilled in the art, both the patterns 26 and 27 may also be formed by use of wet etching instead of dry etching for which the etching gas plasma 25 is used.

After this, the resist pattern 24, i.e., the remaining resist is stripped off using a solvent to obtain a photomask. By washing and inspecting this photomask, a halftone phase shift photomask having the phase shifter pattern 27 is completed, as shown in FIG. 5(e).

For the above-mentioned conventional halftone phase shift photomask, however, it is necessary to provide two layers, i.e., the phase shift and halftone light-blocking layers, resulting in an increase in the number of the steps of blank preparation. There is also an increase in the number of the steps of mask fabrication by reason of a difference in the conditions for etching the halftone light-blocking and phase shift layers. Moreover, it is required to conduct defect inspection for each layer. These pose many problems, for instance, considerable cost, much time needed for mask preparation, the frequent occurrence of defects, etc.

SUMMARY OF THE INVENTION

In view of such situations, an object of the invention is to provide a halftone phase shift photomask which is of much more simplified structure, and so can be prepared much more easily.

Achieved as a result of studies made so as to develop a halftone phase shift photomask that serves well for practical purposes, is of high accuracy and can be fabricated much more easily, the invention underlies the discovery that a halftone light-blocking film and a phase shift layer can be constructed in the form of a single layer.

According to the invention, there is provided a halftone phase shift photomask comprising a transparent substrate and a single halftone light-blocking and phase shift layer that is formed on the surface thereof according to a predetermined pattern and is made up of a material of homogeneous composition, characterized in that:

said single halftone light-blocking and phase shift layer has a film thickness d that is virtually equal to a value defined by $$d=\lambda/\{2(n-1)\}$$

where $\lambda$ is the wavelength at which the photomask is used, and n is the index of refraction of the single layer, or that is an odd-numbered multiple of said value, and has a transmittance lying substantially in the range of 5 to 30%.

In the invention, the halftone light-blocking and phase shift layer may be made up of any one of $CrO_x$, $CrN_x$, $CrO_xN_y$ and $CrO_xN_yC_z$. Or, alternatively, it may be made up of a transparent inorganic or organic material in which a pigment or dye is dispersed. In the latter case, for instance, this layer may be prepared by dispersing light-blocking fine particles throughout spin-on glass.

The halftone phase shift photomask according to the invention, because of being constructed from a transparent substrate and a single halftone light-blocking and phase shift layer that is formed on the surface thereof according to a predetermined pattern and is made up of a material of homogeneous composition, is of very simplified structure. In addition, some considerable reduction in the number of the production steps involved contributes to no occurrence of defect and, at the same time, to curtailing production cost. With the halftone phase shift photomask according to the invention, nonetheless, it is possible to achieve resolution that is as high as would not be achieved with conventional photomasks.

Still other objects and advantages of the invention in part be obvious and will in part be apparent from the specification.

The invention accordingly comprises the features construction, combinations of elements, and arrangement of parts which will be exemplified in the construction hereinafter set forth, and the scope of the invention will be indicated in the claims.

DESCRIPTION OF THE PREFERRED EMBODIMENTS

In the following description, one embodiment of the halftone phase shift photomask according to the invention will be explained, more specifically but not exclusively, with reference to FIG. 1.

Figure 1:
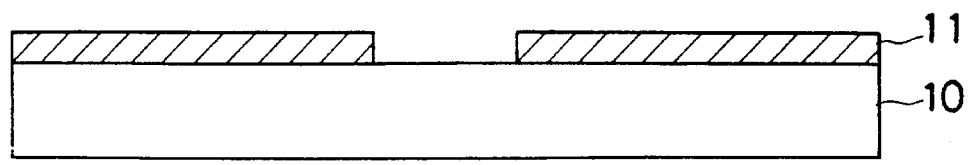
FIG. 1 is a sectional view of a halftone phase shift photomask according to the invention.

Referring first to FIG. 1, one embodiment of the halftone phase shift photomask (reticle) according to the invention is shown in section. This photomask is made up of a quartz substrate 10 and a single halftone light-blocking and phase shift layer 11 formed on the surface of the substrate 10 according to a predetermined pattern.

The halftone light-blocking and phase shift layer 11 should have a film thickness, d, given by $$d=\lambda/\{2(n-1)\}$$

where $\lambda$ is the wavelength at which the reticle is used and n is the index of refraction of the layer 11. In the invention, that film thickness may be an odd-numbered multiple of d. This layer 11 should also have a transmittance of 5 to 30%. To form the halftone light-blocking and phase shift layer 11, for instance, $CrO_x$, $CrN_x$, $CrO_xN_y$ or $CrO_xN_yC_z$ may be deposited on the substrate 10, using a chromium sputtering target and a deposition atmosphere containing gas such as oxygen gas. In this connection, however, it is understood that both the film thickness and transmittance conditions mentioned above must be satisfied by varying the film-forming conditions to control the content of chromium with respect to oxygen, etc.

With the halftone phase shift photomask constructed as mentioned above, therefore, the outward spreading of the light intensity distribution can be avoided, as already explained with reference to FIG. 3, making possible the resolution of a pattern as fine as could not be resolved in the prior art. Moreover, the halftone phase shift photomask of the invention can be fabricated by a single, most basic lithography process that involves the steps of coating the substrate 10 with the single halftone light-blocking and phase shift layer 11, coating a resist layer on the layer 11, writing a predetermined pattern on the resist layer with the use of an exposure system such as an electron beam lithography system to form a resist pattern thereon by development and rinsing, and dry or wet etching the portions of the layer 11 under the openings in the resist pattern.

It is understood that the halftone light-blocking and phase shift layer 11 that meets the transmittance and film thickness conditions mentioned above may also be formed by dispersing a pigment or dye in a transparent inorganic or organic material in place of using an oxide of chromium or the like.

By way of example, reference will then be made to one embodiment of the halftone light-blocking and phase shift layer that is made up of spin-on glass (SOG).

FIG. 2(a–e) is a sectional schematic of the steps for fabricating a halftone phase shift photomask including this layer. A halftone phase shift photomask blank such as one shown in FIG. 2(a) is first provided. In FIG. 2(a), reference numeral 39 represents a substrate, 40 an electrically conductive layer, and 41 a halftone light-blocking and phase shift layer (that has a thickness of about 405 nm with respect to i-line for instance, forms a 180° phase shifter, and has a transmittance lying in the range of 5 to 30%). The halftone light-blocking and phase shift layer 41 is formed by mixing light-blocking fine particles (a few nm to a few tens nm in diameter) of carbon, $SiN_x$, Si or the like with a SOG solution by a dispersing technique, coating the mixture on the substrate, and thermally treating the substrate. The amount of the light-blocking fine carbon or other particles to be mixed may be regulated while monitoring the thermally treated substrate. To achieve uniform mixing, ultrasonic or other treatments may optionally be done. The transmittance may be selected from the range of 5 to 30%, as mentioned above. In this embodiment, the transmittance was regulated to about 16%, using fine particles of carbon.

Figure 2A:
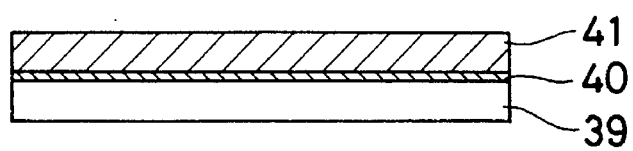
FIG. 2(a–e) is a schematic showing one example of the process for fabricating a halftone phase shift photomask according to the invention.
Figure 2B:
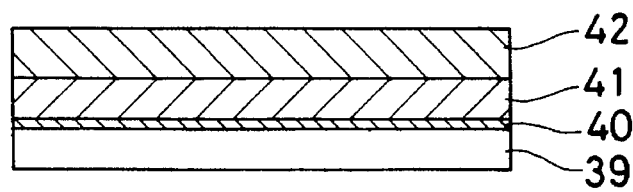
Figure 2C:
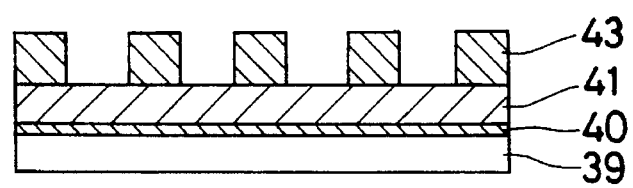

Then, as shown in FIG. 2(b), an ionizing radiation resist 42 made up of, e.g., chloromethylated polystyrene is uniformly coated on the blank by spin coating or other known techniques, followed by drying-by-heating. This drying-by-heating treatment may usually be done at 80° to 150° C. for 20 to 60 minutes, although varying depending on the type of resist used. Then, a pattern is written on the resist layer 42 by ionizing radiation in conventional manners with an exposure system such as an electron beam lithography system, developed with a developer composed mainly of an organic solvent such as ethyl cellosolve or ester, and rinsed with alcohol to form such a resist pattern 43 as shown in FIG. 2(c).

Figure 2D:
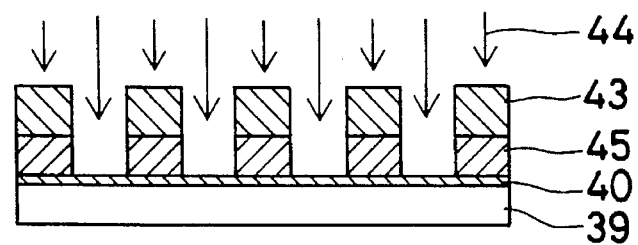

If needed, heat and descumming treatments are subsequently conducted for removal of undesired matters such as resist scum and whisker which remain on the edge portions of the resist pattern 43. Following this, as shown in FIG. 2(d), the portions of the halftone light-blocking and phase shift layer 41 under the openings in the resist pattern 43 are dry etched by etching gas plasma 44 to form a halftone phase shifter pattern 45. As is obvious to those skilled in the art, this shift pattern 45 may also be formed by use of wet etching instead of dry etching for which the etching gas plasma 44 is used.

Figure 2E:
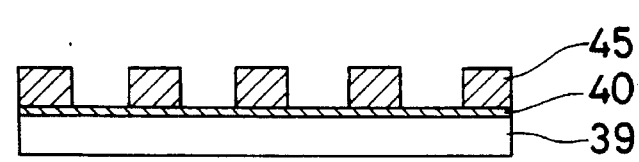
Figure 3A:
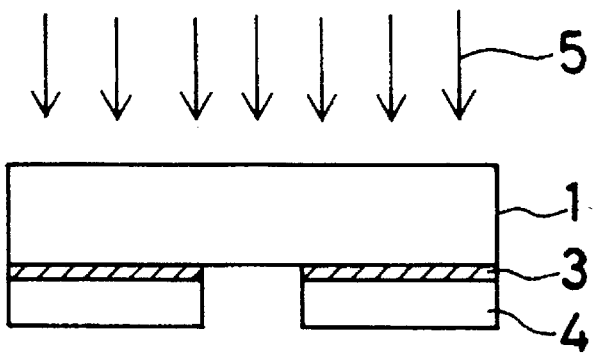
FIG. 3(a–d) is a schematic of the principle of halftone phase shift lithography.
Figure 3B:
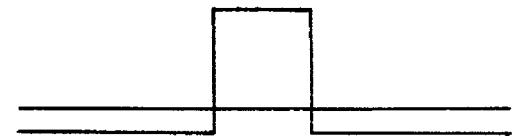
Figure 3C:
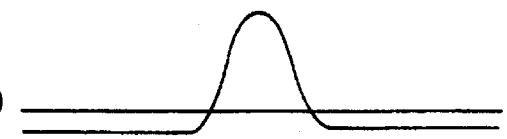
Figure 3D:
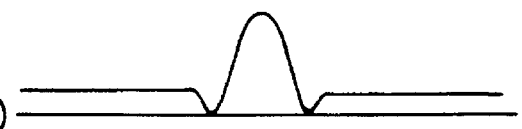
Figure 4A:
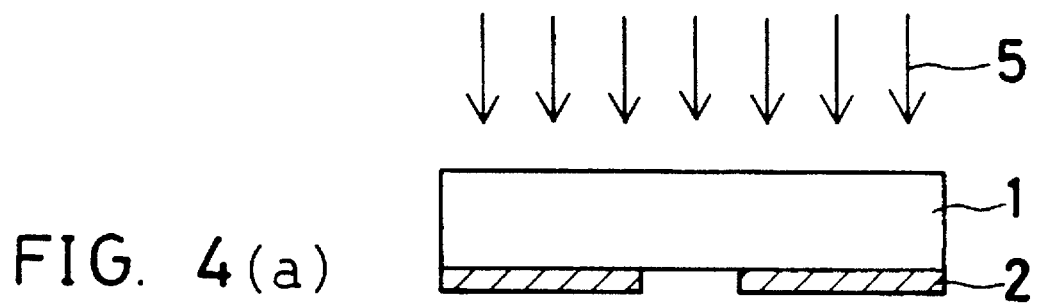
FIG. 4(a–d) is a schematic showing a conventional typical process.
Figure 4B:
Figure 4C:
Figure 4D:
Figure 5A:
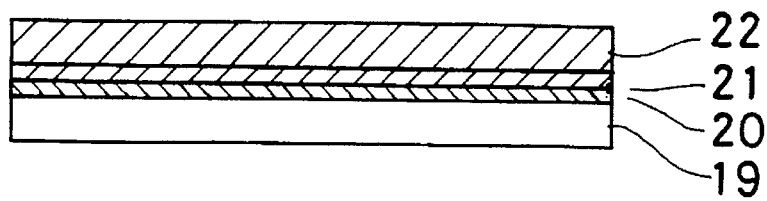
FIG. 5(a–e) is a sectional schematic showing the steps for fabricating a conventional halftone shift photomask.
Figure 5B:
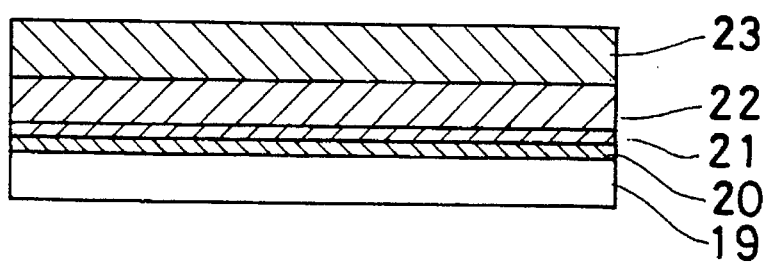
Figure 5C:
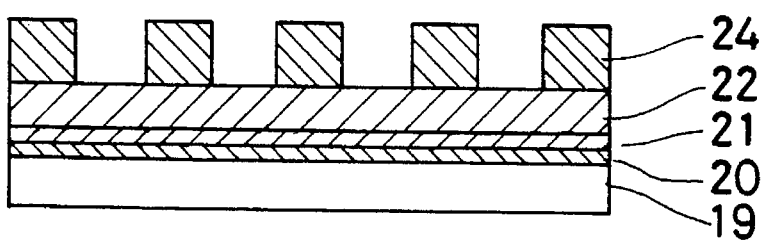
Figure 5D:
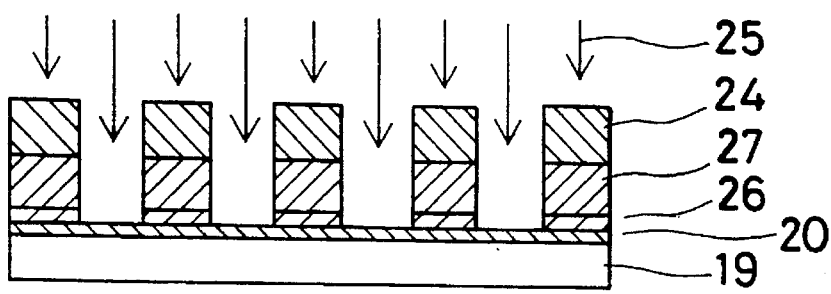
Figure 5E:
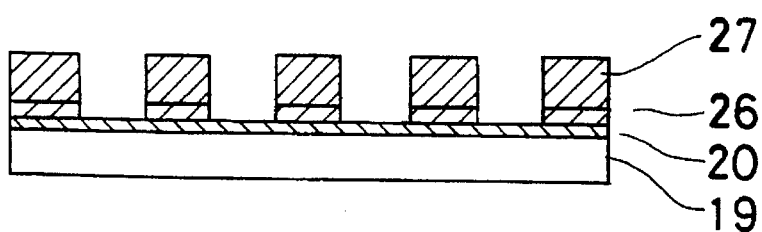

After this, the resist pattern 43, i.e., the remaining resist is stripped off using a solvent to obtain a photomask. By washing and inspecting this photomask, a halftone phase shift photomask having the phase shifter pattern 45 is completed, as shown in FIG. 2(e).

Thus, in the case of the SOG halftone phase shifter pattern prepared by the dispersion of carbon fine particles with the transmittance regulated to about 16%, the transmittance of the photomask blank was ±0.8% at the average value ±3σ (σ is the standard deviation). The displacement of the halftone phase shifter of the halftone phase shift photomask prepared through a smaller number of photosteps was found to be at most ±0.1 μm at the average value ±3σ (σ is the standard deviation), revealing that the obtained halftone phase shift photomask is of high accuracy. Pattern distortion or other defects are not found whatsoever.

Recent LSIs and VLSIs increase in the degree of integration and, with this, photomasks are required to have higher accuracy and become more complicated in structure, posing some problems such as an increase in the number of the steps involved, the frequent occurrence of defects due to dust. In addition, this incurs some considerable production costs.

The halftone phase shift photomask according to the invention, because of being constructed from a transparent substrate and a single halftone light-blocking and phase shift layer that is formed on the surface thereof according to a predetermined pattern and is made up of a material of homogeneous composition, is of very simplified structure. In addition, some considerable reduction in the number of the production steps involved contributes to no occurrence of defect and, at the same time, to curtailing production cost. With the halftone phase shift photomask according to the invention, nonetheless, it is possible to achieve resolution that is as high as would not be achieved with conventional photomasks.

What we claim is:

1. A halftone phase shift photomask comprising:

a transparent substrate having a substantially flat surface, and a single halftone light-blocking and phase shift layer, produced by varying the content of at least one of oxygen, nitrogen and carbon with respect to chromium, and having a homogeneous composition, said single halftone light-blocking and phase shift layer being formed on said surface of said transparent substrate according to a predetermined pattern, said single halftone light-blocking and phase shift layer being the only phase shift layer of said halftone phase shift photomask, said single halftone light-blocking and phase shift layer having a film thickness d that is virtually equal to one of a value defined by $$d=1/\{2(n-1)\}$$

where 1 is the wavelength at which the halftone phase shift photomask is used, and n is the index of refraction of the single layer, and an odd-numbered multiple of said value, and wherein said single halftone light-blocking and phase shift layer has a transmittance lying substantially in the range of 5 to 30%.

2. A halftone phase shift photomask as claimed in claim 1, wherein said halftone light-blocking and phase shift layer is made up of any one of $CrO_x$, $CrN_x$, $CrO_xN_y$, and $CrO_xN_yC_z$.

3. A halftone phase shift photomask as claimed in claim 2, wherein said halftone light-blocking and phase shift layer is made of spin-on glass and light-blocking fine particles dispersed therein.

4. A halftone phase shift photomask comprising:.

a transparent substrate and a single halftone light-blocking and phase shift layer that is formed on a surface of said transparent substrate according to a predetermined pattern, said single halftone light-blocking and phase shift layer being composed of a material of homogeneous composition, said single halftone light-blocking and phase shift layer having a film thickness d that is virtually equal to one of a value defined by $$d=\lambda/\{2(n-1)\}$$

where λ is the wavelength at which the halftone phase shift photomask is used, and n is the index of refraction of the single layer, and an odd-numbered multiple of said value, and wherein said single halftone light-blocking and phase shift layer has a transmittance lying substantially in the range of 5 to 30%, wherein said single halftone light-blocking and phase shift layer is produced by varying the content of a pigment dispersed in one of a transparent inorganic material and an organic material.

5. A halftone phase shift photomask comprising:

a transparent substrate having a substantially flat surface, and a single halftone light-blocking and phase shift layer that is formed on said surface of said transparent substrate according to a predetermined pattern, said single halftone light-blocking and phase shift layer being composed of a material of homogeneous composition, characterized in that said single halftone light-blocking and phase shift layer has a film thickness d that is virtually equal to one of a value defined by $$d=l/\{2(n-1)\}$$

where l is the wavelength at which the halftone phase shift photomask is used, and n is the index of refraction of the single layer, and an odd-numbered multiple of said value, and has a transmittance lying substantially in the range of 5 to 30%, and wherein said single halftone light-blocking and phase shift layer is the only phase shift layer of said halftone phase shift photomask.

6. A halftone phase shift photomask as claimed in claim 5, wherein said single halftone light-blocking and phase shift layer is made up of any one of $CrO_x$, $CrN_x$, $CrOxN_y$ and $CrO_xN_yC_z$.

7. A halftone phase shift photomask as claimed in claim 5, wherein said single halftone light-blocking and phase shift layer is made up of one of a transparent inorganic material and an organic material and a pigment dispersed therein.

8. A halftone phase shift photomask as claimed in claim 6, wherein said single halftone light-blocking and phase shift layer is made of spin-on glass and light-blocking fine particles dispersed therein.

9. A halftone phase shift photomask as claimed in claim 5, wherein said single layer is made up of one of a transparent inorganic material and an organic material and a dye dispersed therein.

* * * * *